United States Patent [19]
Pettit et al.

[11] Patent Number: 5,890,959
[45] Date of Patent: Apr. 6, 1999

[54] HIGH EFFICIENCY BLOWER SYSTEM WITH INTEGRAL BACKFLOW PREVENTOR

[75] Inventors: Julie T. Pettit; Theodore Ernst Bruning, III; Robert Ducharme; Michael K. Ferris; Eugene McNany, all of Colorado Springs, Colo.

[73] Assignee: Digital Equipment Corporation, Houston, Tex.

[21] Appl. No.: 52,751

[22] Filed: Mar. 31, 1998

[51] Int. Cl.⁶ ........................................... H05K 5/00
[52] U.S. Cl. ........................... 454/184; 137/849; 454/353
[58] Field of Search ..................................... 454/184, 346, 454/347, 353, 359; 157/849

*Primary Examiner*—Harold Joyce
*Assistant Examiner*—Derek Boles
*Attorney, Agent, or Firm*—Holland & Hart LLP

[57] ABSTRACT

In a multiblower system for cooling electronic components, each blower has a backflow preventor. The backflow preventor has two pieces of flexible material and a screen attached to the intake side of the blower assembly. Each of the pieces of flexible material is scored through to form a petaled opening through which air may pass. The scores on one of the pieces of flexible material are out of alignment with the scores on the other piece when assembled together in the blower assembly. When the blower is running, the petals in the pieces of flexible material open to allow air to pass through the blower assembly. When the blower is stopped, the petals are closed against the screen due to the pressure differential between the inside of the enclosure and the outside of the enclosure caused by the effect of the draw of the other blowers in the system. The non-aligned scores on the two pieces of flexible material causes a seal to be formed through which air may not pass back into the enclosure through the stopped blower. In addition, the flexible material acts as a damper between the blower assembly and the electronics enclosure. Further, the petaled opening of the backflow preventor directs air more toward the center of the blower creating a laminar airflow, reducing the turbulence of the air as it is removed from the enclosure.

4 Claims, 4 Drawing Sheets

5,890,959

HIGH EFFICIENCY BLOWER SYSTEM WITH INTEGRAL BACKFLOW PREVENTOR

FIELD OF THE INVENTION

This invention relates generally to cooling systems and more particularly to multi-blower cooling systems in electronic systems enclosures.

BACKGROUND OF THE INVENTION

Electronic system enclosures often employ multi-blower, or multi-fan, systems for cooling. A typical multi-blower system may use two blowers for cooling. Each blower has an associated opening located on the system enclosure through which hot air is exhausted from the system enclosure.

In the event that one of the blowers fails, the blower still in operation is able to draw air into the electronic system enclosure through the exhaust opening of the failed blower, a condition called backflow. The backflow of air through the failed blower impairs the ability of the blower still in operation to cool the system. A way of preventing backflow of air through a stopped fan in a blower system is needed.

In addition, movement of large volumes of air is typically required in order to cool enclosures effectively. To keep the size of the blowers small, the blower rate is increased in order to move a sufficient quantity of air. The speed may be for example 2000 to 6000 rpm. The vibration generated by the spinning fans inside the blower assemblies can disturb components inside the enclosure. For instance, the vibration could cause errors in disk drives. A vibration damping system is needed to protect the components inside the electronics enclosure.

SUMMARY OF THE INVENTION

The problems of backflow in a blower system having multiple fans are solved by the present invention of an integral backflow preventor which keeps air from entering through a stopped fan in the blower system.

Each blower in the blower system has a backflow preventor. The backflow preventor has two pieces of flexible material attached to the intake side of the blower assembly. A screen is placed over the two pieces of flexible material at the intake side of the blower assembly. Each of the pieces of flexible material is scored through to form a petaled opening through which air may pass. The scores on one of the pieces of flexible material are out of alignment with the scores on the other piece of flexible material when assembled together in the blower assembly.

When the blower is running, the petals in the pieces of flexible material open to allow air to pass through the fan assembly. When the blower is stopped, the pieces of flexible material are closed against the screen. The pressure differential between the inside of the enclosure and the outside of the enclosure caused by the effect of the draw of the other fans in the blower system holds the petals against the screen. The non-aligned scores on the two pieces of flexible material causes a seal to be formed through which air may not pass back into the enclosure through the stopped blower.

In addition, the flexible material acts as a damper between the blower assembly and the electronics enclosure thereby protecting the components inside the enclosure from vibration from the blower system. Further, the petaled opening of the pieces of flexible material directs air more toward the center of the blower creating a laminar airflow, reducing the turbulence of the air as it is removed from the enclosure.

BRIEF DESCRIPTION OF THE DRAWINGS

The present invention together with the above and other advantages may best be understood from the following detailed description of the embodiments of the invention illustrated in the drawings, wherein.

DETAILED DESCRIPTION

Figure 1:
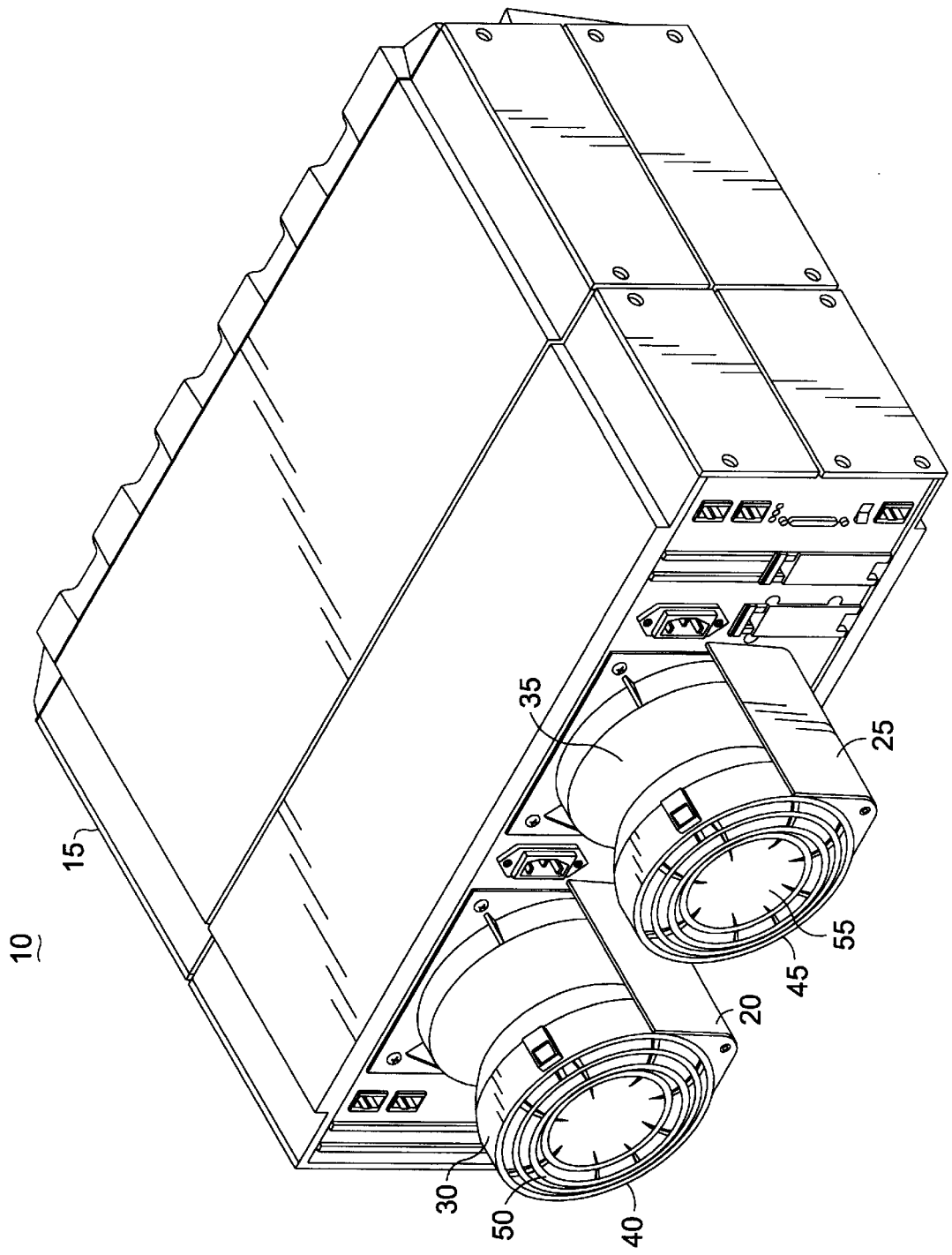
FIG. 1 is a perspective view of an enclosure including a cooling system with an integral backflow preventor apparatus in accordance with the principles of the invention.

FIG. 1 is a perspective view of a computer system 10 having heat-generating components inside an enclosure 15. The enclosure 15 is equipped with a multifan blower system having two blowers 20, 25 to provide cooling. In the present embodiment of the invention, air is drawn through the enclosure 15 and exhausted through the blowers 20, 25.

Each blower 20, 25 has a housing 30, 35. Enclosed in each housing 30, 35 is an air moving device such as a vane-axial fan, a tube-axial fan, a centrifugal blower, or a backward-curve impeller. Each blower 20, 25 has an exit opening 40, 45 covered with a grill 50, 55. In operation, the fan enclosed in each housing 30, 35 moves air from inside the enclosure 15 through the housing 30, 35 and exhausts the air out through each opening 40, 45.

Figure 2:
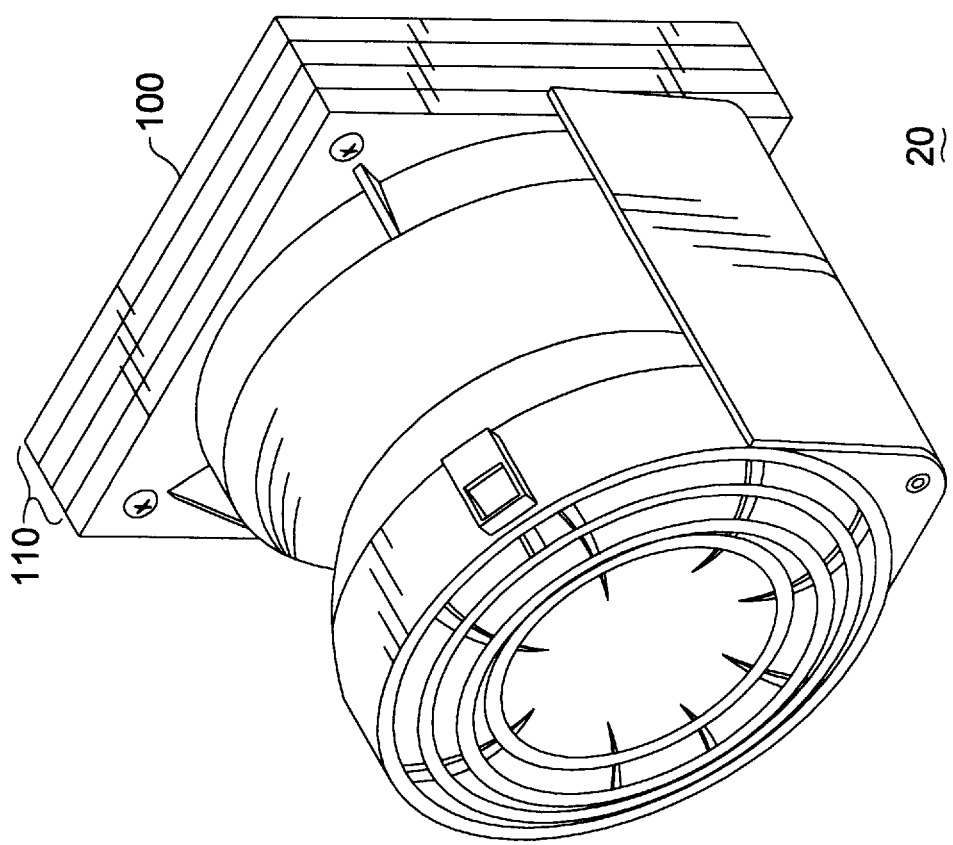
FIG. 2 is a perspective view of a blower of FIG. 1, the blower having the integral backflow preventor apparatus.

FIG. 2 shows one of the blowers 20 of FIG. 1 separated from the enclosure 15. The blower intake 100, which in operation faces the enclosure 15, has a layered opening which makes up the backflow preventor 110. The backflow preventor is shown in more detail in FIG. 3.

Figure 3:
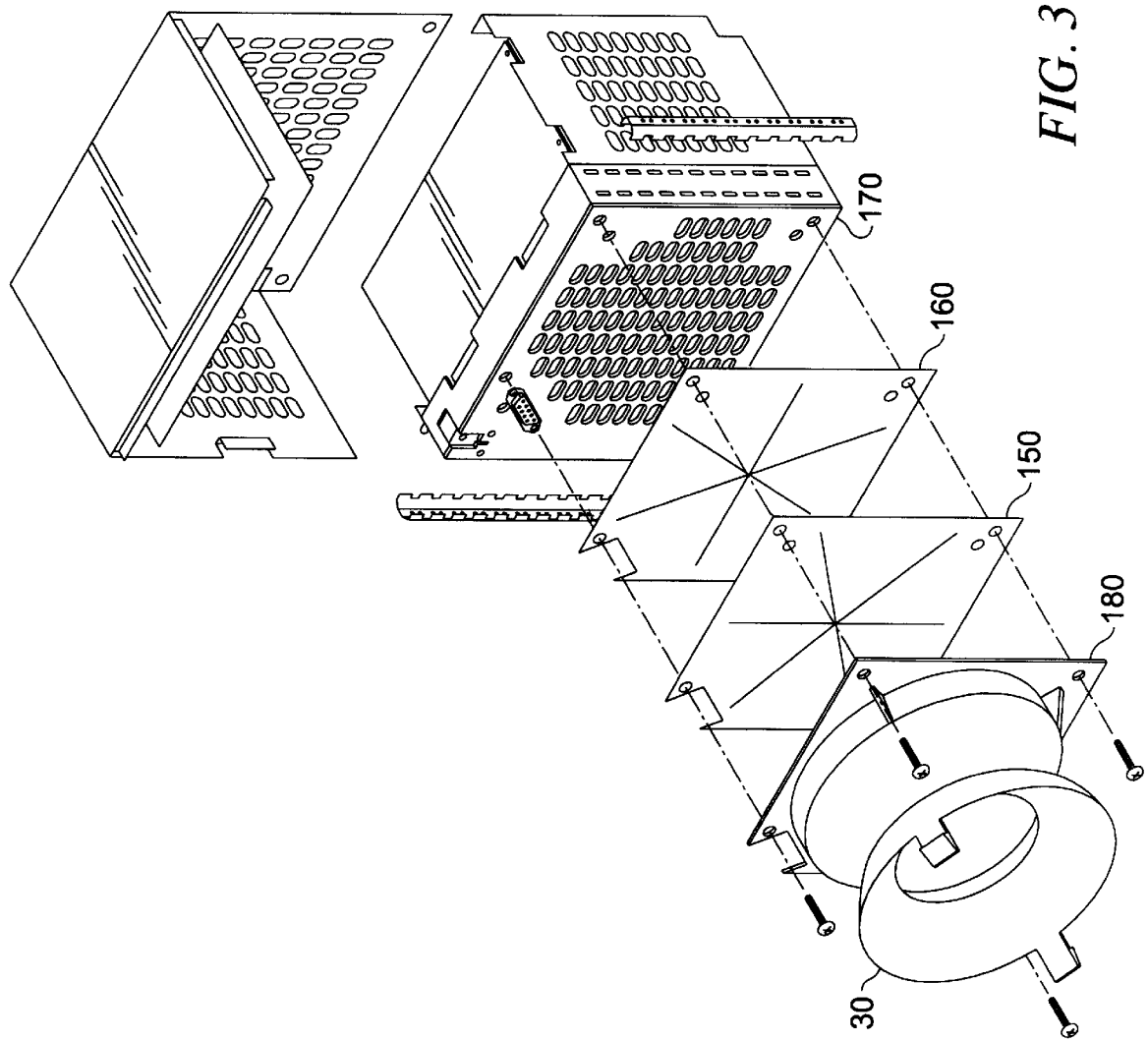
FIG. 3 is a perspective view of the blower of FIG. 2 where the backflow preventor is shown in exploded view.

FIG. 3 shows the blower 30 of FIG. 2 rotated so that the backflow preventor 110 attached to the blower intake 100 is shown. The backflow preventor 110 is shown in exploded view. The backflow preventor 110 has a plurality of layers: a first layer of flexible material 150, a second layer of flexible material 160, and a grate 170 through which air may pass. The grate 170 may be a distinct layer or, as shown in FIG. 3, the grate 170 may be a side of the electronic system enclosure. The first 150 and second 160 layers of flexible material and the grate 170 are attached to a flange 180 on the fan housing 30. The layers of flexible material 150, 160 and the grate 170 are aligned on the flange 180 by means of alignment pins. The flange and alignment pins are by way of an example alignment and attachment arrangement. Other alignment and attachment arrangements are possible.

In the present embodiment, the blower 20 is used to exhaust air from the enclosure 15 containing computer components. The blower intake 100 with the backflow preventor 110 is attached to the enclosure 15 and the blower grill 50 faces the out with respect to the enclosure 15. Air is drawn from the enclosure 15, through the grate 120 and the flexible layers 150, 160 and is exhausted through the grill 50.

Figure 4:
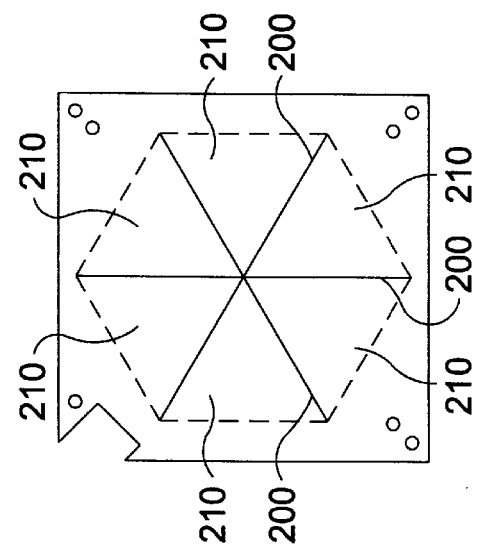
FIG. 4 is a top view of a first layer of the backflow preventor of FIG. 3.

FIG. 4 is a top view of the first layer of flexible material 150 of FIG. 3. The first layer 150 is a sheet of material which is shaped and dimensioned to fit the flange 180 on the blower intake 100. The first layer 150 is for example 1/16" thick. Any thickness which allows flexing while maintaining dimensions may be used. The material may be any flexible material which retains dimensions such as fiber-reinforced rubber. The second layer 160 of flexible material is similarly shaped and dimensioned to the first layer 150 of flexible material.

As shown in FIG. 4, the first layer of flexible material 150 is scored through to form an opening. The scores 200 are cross-cuts which cross each other at a first common point to form substantially triangularly-shaped flexible flaps called petals 210.

Figure 5:
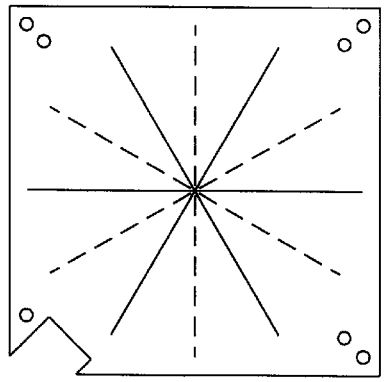
FIG. 5 is top view of a second layer of the backflow preventor aligned above the first layer of FIG. 4; and, FIG. 6 is a perspective view of the first and second layers of FIG. 5 with a simple airflow profile.

FIG. 5 shows a top view of the second layer of flexible material 160 placed on top of the first layer of flexible material 150. The second layer 160 has scores 230 which cross each other at a second common point making petals 240 like the first layer 150. The scores are shown in solid line 230 for the second layer 160 and in dotted line 200 for the first layer 150. The scores 230 in the second layer 160 are made so that they are not aligned with the scores 200 in the first layer 150 with the first common point and the second common point in vertical alignment when the layers are assembled together in the backflow preventor 110.

In operation, the pressure of the air drawn from the enclosure and through the blower 20 when the blower 20 is running causes the petals 210, 240 to flex and open so that air may pass through. In the instance where the first blower 20 is not operating and the second blower 25 is operating, the resultant back pressure in the first blower 20 urges the petals 210, 240 of the layers of flexible material against the grate 170 closing the petals 210, 240 against each other. The non-aligned scores 200, 230 in the two layers 150, 160 prevent air from passing back through the blower 20 and thereby block air from flowing back in through the inoperable blower 20.

Figure 6:
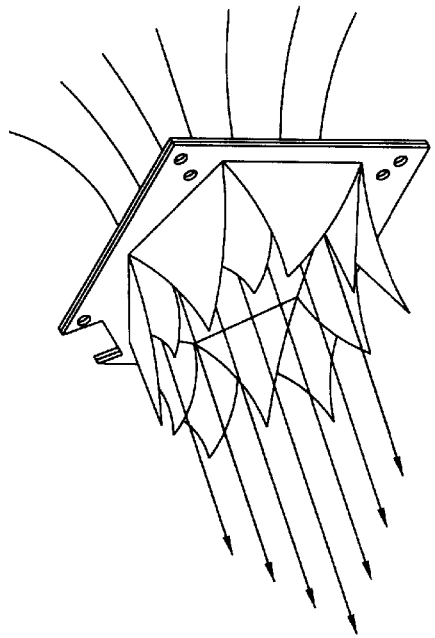

FIG. 6 shows a perspective view of the first 150 and second 160 layers of flexible material layered together in operation with a simple airflow profile. The petaled opening of the pieces of flexible material create a curved inlet venturi which directs air toward the center of the blower creating a laminar airflow, and reducing the turbulence of the air as it is removed from the enclosure. In addition, the flexible material acts as a damper between the blower assembly and the electronics enclosure thereby protecting the components inside the enclosure from vibration from the blower system.

It is to be understood that the above-described embodiments are simply illustrative of the principles of the invention. Various and other modifications and changes may be made by those skilled in the art which will embody the principles of the invention and fall within the spirit and scope thereof.

What is claimed is:

1. A blower system, comprising:
   a housing having a first opening and a second opening;
   a first layer of flexible material positioned over the first opening, the first layer of flexible material having a first plurality of scores crossing at a first point, the first plurality of crossed scores forming a first plurality of petals;
   a second layer of flexible material positioned over the first layer of flexible material, the second layer of flexible material having a second plurality of scores crossing at a second point, the second plurality of crossed scores forming a second plurality of petals, said first layer and said second layer positioned over the first opening so that the first point and the second point are in vertical alignment and the first plurality of scores and the second plurality of scores are out of alignment with respect to each other; and,
   a grate fastened over the second layer of flexible material, wherein movement of air through the first opening into the housing causes the petals to open allowing the air to pass through the second opening, and movement of air through the second opening urges the petals against the grate creating a seal preventing air from passing through the first opening.

2. The blower system of claim 1 wherein the flexible material is a fiber-reinforced rubber.

3. The blower system of claim 1 further comprising:
   an enclosure to which the housing is attached wherein the grate is a side of the enclosure.

4. The blower system of claim 1 wherein each piece of flexible material has three cross-cuts.

\* \* \* \* \*